(12) United States Patent
Murakami et al.

(10) Patent No.: US 6,894,589 B2
(45) Date of Patent: May 17, 2005

(54) RADIO FREQUENCY RESONATOR AND METHOD FOR PRODUCING THE SAME

(75) Inventors: Yoshinobu Murakami, Saijyo (JP); Shigeru Ohno, Saijyo (JP)

(73) Assignee: Sumitomo Heavy Industries, Ltd., Tokyo (JP)

( * ) Notice: Subject to any disclaimer, the term of this patent is extended or adjusted under 35 U.S.C. 154(b) by 0 days.

(21) Appl. No.: 10/100,021

(22) Filed: Mar. 19, 2002

(65) Prior Publication Data

US 2003/0179054 A1 Sep. 25, 2003

(51) Int. Cl.[7] .................................................. H01P 7/00
(52) U.S. Cl. ........................................ 333/219; 333/227
(58) Field of Search ................................ 333/219, 227, 333/230; 315/505, 506

(56) References Cited

U.S. PATENT DOCUMENTS

| | | | | |
|---|---|---|---|---|
| 3,955,274 A | * | 5/1976 | Imai et al. | .................... 29/600 |
| 5,089,746 A | * | 2/1992 | Rosenblum et al. | ..... 315/111.81 |
| 5,614,877 A | * | 3/1997 | Raghavan et al. | .......... 333/227 |
| 6,060,833 A | * | 5/2000 | Velazco | .................... 315/5.41 |
| 6,262,638 B1 | | 7/2001 | Scherer | |

FOREIGN PATENT DOCUMENTS

| | | |
|---|---|---|
| JP | 02-106900 | 4/1990 |
| JP | 03-028578 | 2/1991 |
| JP | 05-054999 | 3/1993 |
| JP | 06-010919 | 12/1994 |
| JP | 07-048676 | 2/1995 |
| JP | 09-194974 | 7/1997 |
| JP | 2000-042736 | 2/2000 |
| JP | 2000-124149 | 4/2000 |
| JP | 2001-351800 | 12/2001 |

\* cited by examiner

*Primary Examiner*—Robert Pascal
*Assistant Examiner*—Kimberly E Glenn
(74) *Attorney, Agent, or Firm*—Arent Fox PLLC

(57) ABSTRACT

A dished head and a wall part are integrally formed in one body by spinning, using a flat aluminum based material, and then a corrosion-proof protective coating is formed on the whole surface by the Irridite process to complete the canister. The combination of appropriate material selection and production process saves the processing time (man-hour) needed for forming resonator canisters and its surface treatment, improves the thermal conductivity, and consequently decreases individual differences of the radio frequency loss in resonator canisters.

8 Claims, 4 Drawing Sheets

RADIO FREQUENCY RESONATOR AND METHOD FOR PRODUCING THE SAME

BACKGROUND OF THE INVENTION

1. Field of the Invention

This invention relates to a radio frequency resonator and a method for producing the same, and more specifically, to a radio frequency resonator made of aluminum, which is used in accelerators, beam irradiation apparatuses, and ion implantation apparatuses etc. and to a method for producing the same.

2. Description of the Prior Art

Radio frequency resonators made of aluminum are used as main units in accelerators, beam irradiation apparatuses, ion implantation apparatuses, etc. An example of an ion implantation machine used for implanting ions into silicon wafers 8 is shown in FIG. 1, and has a linear accelerator 14 employing a number of the aluminum radio frequency resonators 20 as shown in FIG. 2. In the drawings, the numeral 10 denotes an ion source, 12 and 16, analyzer magnets, and 18, a scanning unit.

As shown in FIG. 3 in detail, a container 24 of the radio frequency resonator 20 mainly comprises: a block 25, a dished head 26, a wall 28, and a top 30. The block 25 and dished head 26 are fitted to the wall 28, at the side of a cylindrical electrode 22 to be inserted into a beam passage of the linear accelerator 14. The wall 28 is composed of a single-layered cylinder. The top 30 is welded to the wall 28 at the opposite side to the electrode 22. The container 24 as constituted has three weld seam lines W.

This container 24 has been fabricated so far, as illustrated in FIG. 4 in detail, in a process comprising: forming a wall 28 by bending a rectangular flat plate 32 by means of rolls 34, followed by seam welding with a welding torch 36; spinning a disk-shaped plate 42 into a dished head 26 by means of a spatula tool 46 onto a die 44 to follow its shape; welding the dished head 26 to the wall 28 with the welding torch 36; and welding a top and block to the wall 28.

Herein, all of the dished head 26, wall 28 and top 30 have been made of aluminum alloys such as A5052 and A6061-T6, with rather high electrical resistance, for keeping mechanical strength.

In addition, in order to reduce the power loss caused by this electrical resistance, the inner surface of the container has been plated with a metal of low electrical resistance such as copper and silver by plating with masking of the outer surface of the container. The reasons why only the inner, but not outer, surface has metallic coating is that the outer surface, if copper or silver plated, would easily be oxidized or discolored when touched with hand, which eventually would result in the deterioration in appearance.

However, the radio frequency current, flowing on the resonator inner surface, is limited within a depth, the skin depth, which depends on the frequency from the skin effect. Therefore, metal-coated layer is usually about twice as thick as the skin depth, which becomes thicker corresponding to lower frequency applications. A low radio frequency application in 13.56 MHz, for example, needs a plating thickness of around 40 $\mu$m. However, it is practically impossible to keep the plating thickness with enough uniformity and reproducibility, over the entire resonator inner surface with complicated shape. Furthermore, plating thickness is very difficult to be inspected in quality control. Consequently, the plating thickness is liable to differ by each individual container, which eventually causes individual differences in the radio frequency loss among resonator containers.

Theoretically, the electrical conductivity is clearly higher in the plated layer, if thick enough, than in the substrate. However, if the plated layer is thinner than the skin depth, the electrical conduction is shared with structural material of the container, an aluminum alloy, and eventually, the apparent electrical resistance increases. Due to the difficulty in thickness control, the performance of resonators eventually depends on the uncontrollable plating thickness, which has been a fundamental drawback so far.

In addition, the hardness of aluminum alloy like A6061-T6 used in a resonator container cannot allow the dished head and wall to be formed integrally in one body, and the low thermal conductivity of the alloy causes surface temperature rise, to invite, eventually, unfavorable increase in electrical resistance.

Furthermore, there have been problems of high production cost because the production of resonator containers comprises welding of many components and metal plating with masking, both of which need a lot of manual labor, resulting in much processing time (man-hour).

SUMMARY OF THE INVENTION

This invention intends to solve the abovementioned problems involved in the conventional resonator containers and their production; by aiming at saving processing time (man-hour) in the fabrication of containers and their surface treatment, improving the thermal conductivity, and decreasing the individual differences in the radio frequency loss of containers.

This invention has solved the abovementioned problems by providing a resonator with a container made of an aluminum based material in which at least a dished head and a wall part are integrally formed.

The aluminum based material may be a pure aluminum such as A1050-O.

In this constitution, a corrosion-proof protective coating may be formed on the surface of the container.

The protective coating may be a yellow irridite.

The container may be composed of:

a main body having the dished head and the wall part, both of which are made of the aluminum based material and are integrally formed in one body; and a block and a top, both of which are made of an aluminum alloy and are welded to the main body.

The aluminum based material may be a pure aluminum such as A1050-O, and the aluminum alloy may be, for example, A5052-H112.

The whole surfaces of the container, including not only an inner surface but also an outer surface, can be covered with a corrosion-proof protective coating.

The protective coating may be a yellow irridite.

In addition, the present invention intends to solve the abovementioned problems by providing a method for producing a radio frequency resonator with a container, including the steps of: integrally forming at least a dished head and a wall part by spinning from a flat aluminum based material (for example, in a disk shape); and performing an Irridite process to form a corrosion-proof protective coating on a surface thereof to complete the container.

The aluminum based material may be a pure aluminum such as A1050-O.

A block and a top can be welded, prior to the Irridite process, to the main body composed of the mirror plate part and the wall part integrally formed in one body.

The block and the top may be made of an aluminum alloy. The aluminum alloy may be, for example, A5052-H112.

The Irridite process may be performed by immersing the container in a treatment solution without masking of the container.

In the invention, forming the aluminum based material (in particular, a pure aluminum) integrally in one body ensures both sufficient electrical and thermal conductivity, and necessary mechanical strength as well. The application of the Irridite process, when needed, provides corrosion protection and increased electrical conductivity.

According to the invention, the usage of the aluminum based material and the formation of the corrosion-proof protective coating, when needed, can ensure smaller dispersion of the radio frequency loss in resonator canisters, and save processing time (man-hour) needed for their surface treatments.

When the pure aluminum is used in particular, the usage thereof can also contribute to the increase in the thermal conductivity of the resonator canister.

Furthermore, integral forming combined with the usage of the aluminum based material can save the processing time (man-hour) needed for resonator container production.

These and other objects, features and advantages of the present invention will become more apparent upon a reading of the following description and appended drawings.

BRIEF DESCRIPTION OF THE DRAWINGS

The preferred embodiments will be described with reference to the drawings, wherein like elements have been denoted throughout the figures with like reference numerals, and wherein.

DESCRIPTION OF THE PREFERRED EMBODIMENTS

Hereinafter the preferred embodiments of the present invention will now be described in detail with reference to the accompanying drawings.

Figure 1:
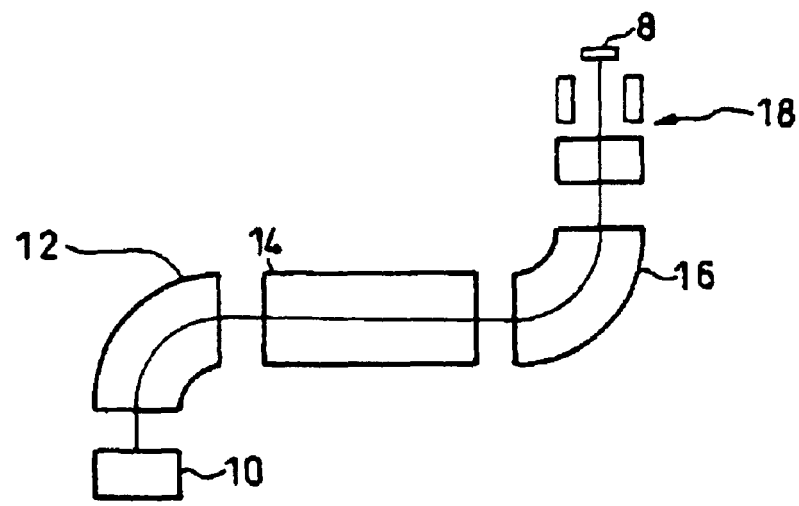
FIG. 1 is a view showing a ion beam passage for illustrating the whole configuration of an ion implanter, equipped with a linear accelerator having radio frequency resonators according to the present invention.
Figure 2:
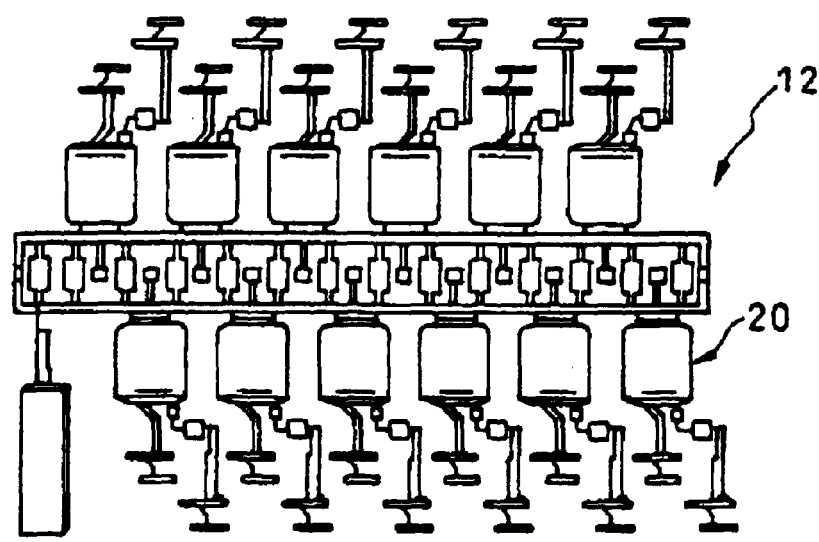
FIG. 2 is a cross-sectional view illustrating the linear accelerator used in the ion implanter, in detail.
Figure 3:
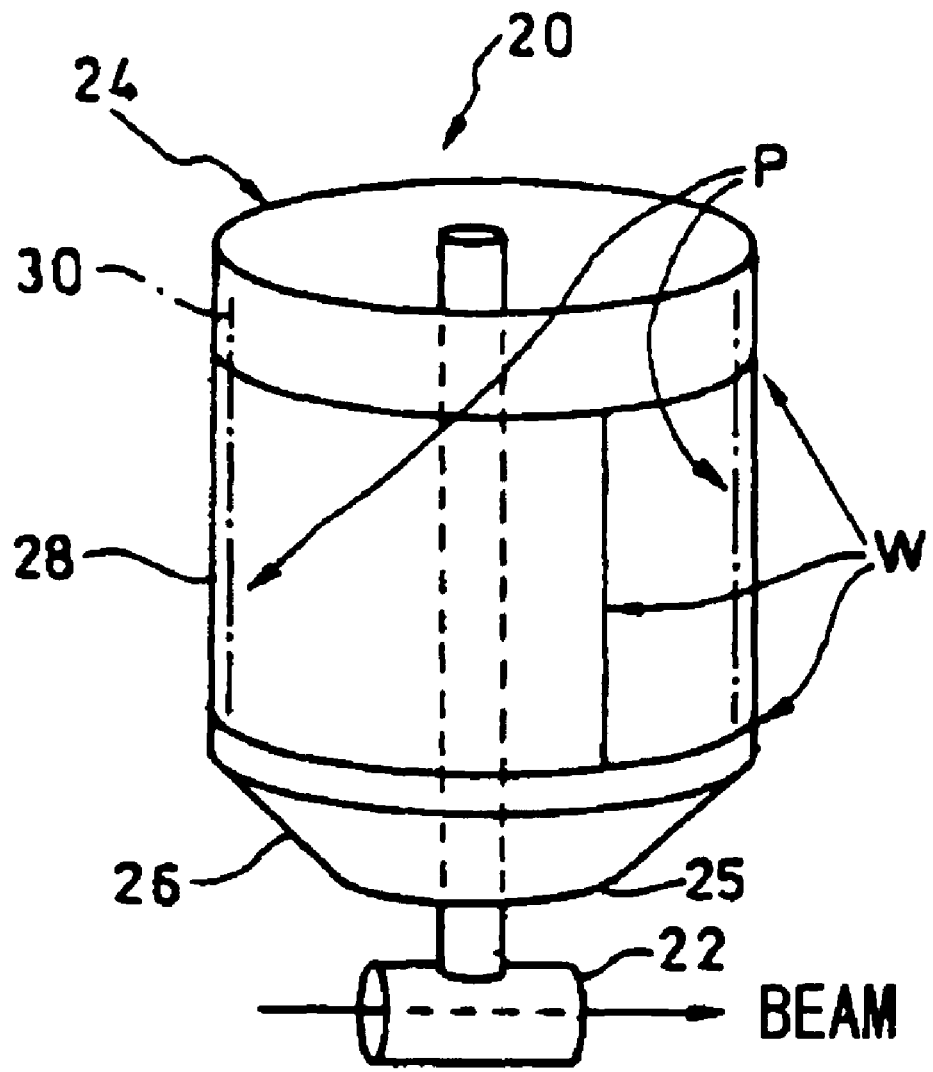
FIG. 3 is a perspective view illustrating the constitution of a conventional radio frequency resonator canister used in the abovementioned linear accelerator.
Figure 4:
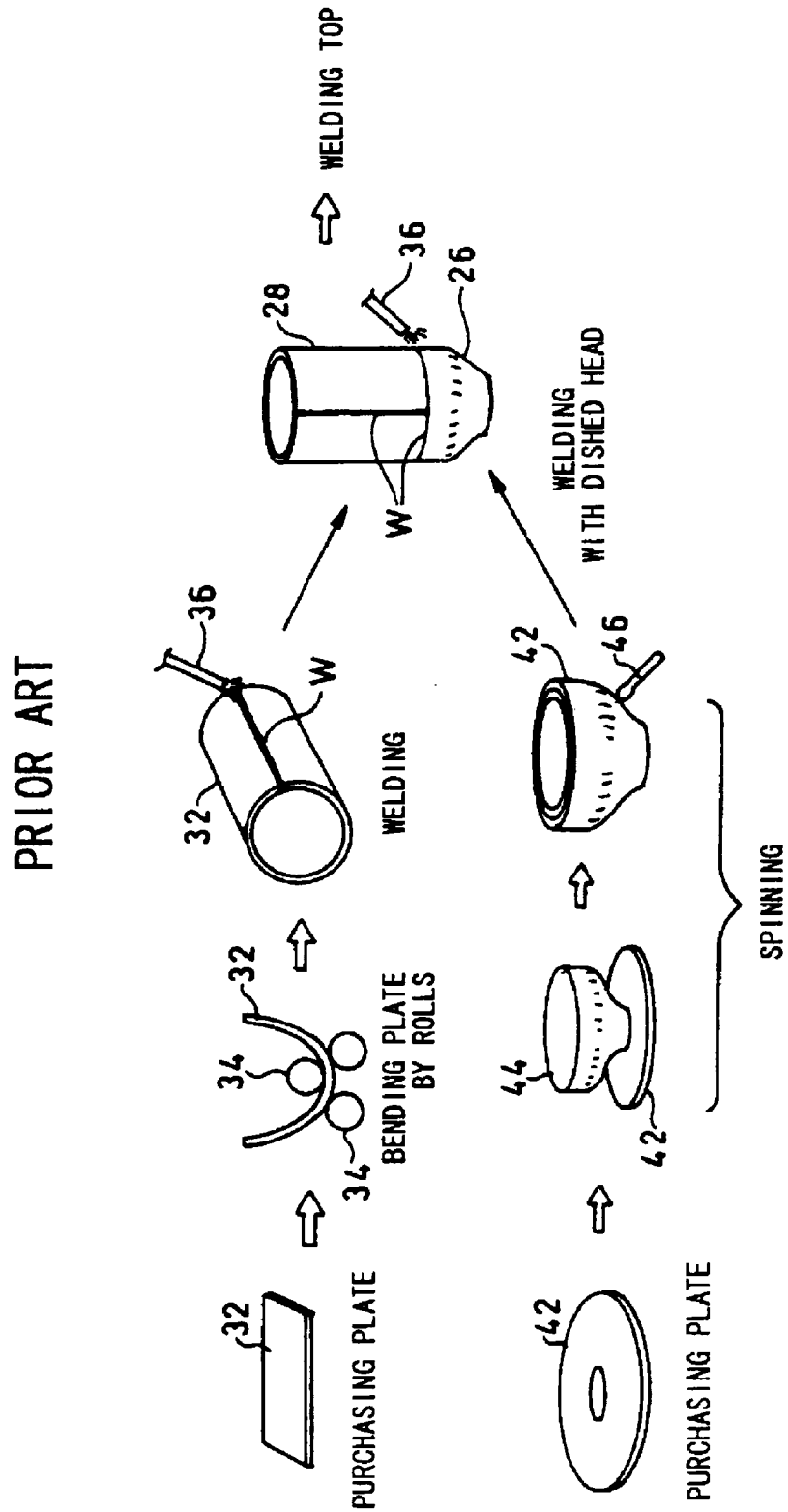
FIG. 4 shows schematic views illustrating a process for producing a conventional resonator container.
Figure 5:
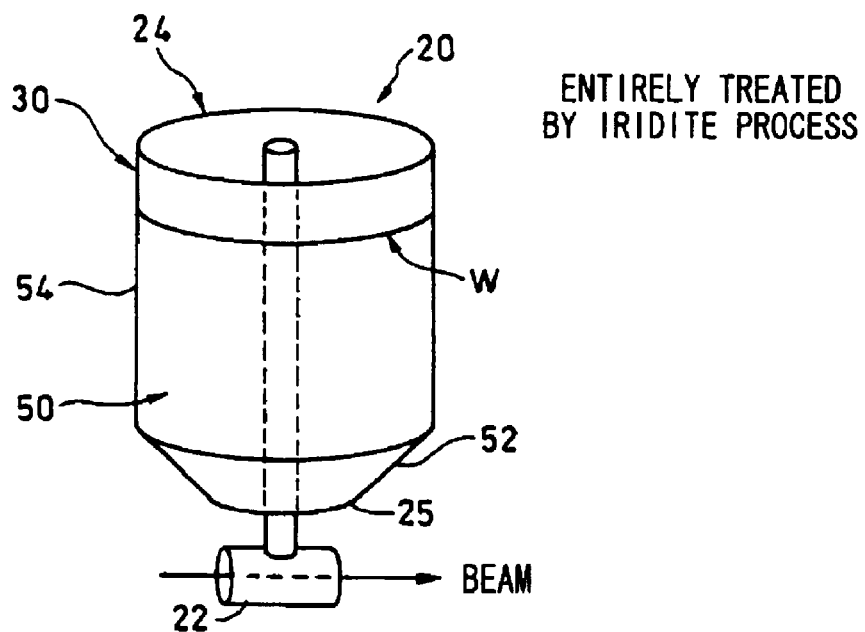
FIG. 5 is a perspective view illustrating a structure of a radio frequency resonator according to an embodiment of the invention.

A preferred embodiment of the radio frequency resonator container in this invention, as illustrated in FIG. 5, is composed of: a main body 50 having parts of a dished head 52 and a wall 54, both of which are formed integrally in one body from a pure aluminum, for example, A1050-0; and a block 25 and a top 30, both of which are made of an aluminum alloy, for example, A5052-H112, and welded to bottom and top of the main body 50, respectively. For preventing the resonator surface from corrosion, the whole surface area, including not only inner but also outer surface, are covered with Irridite coating, for example, of 5 μm in thickness to meet MIL-C-5541 Standard. In this Irridite process, the canister is immersed in the treatment solution, with no masking.

Figure 6:
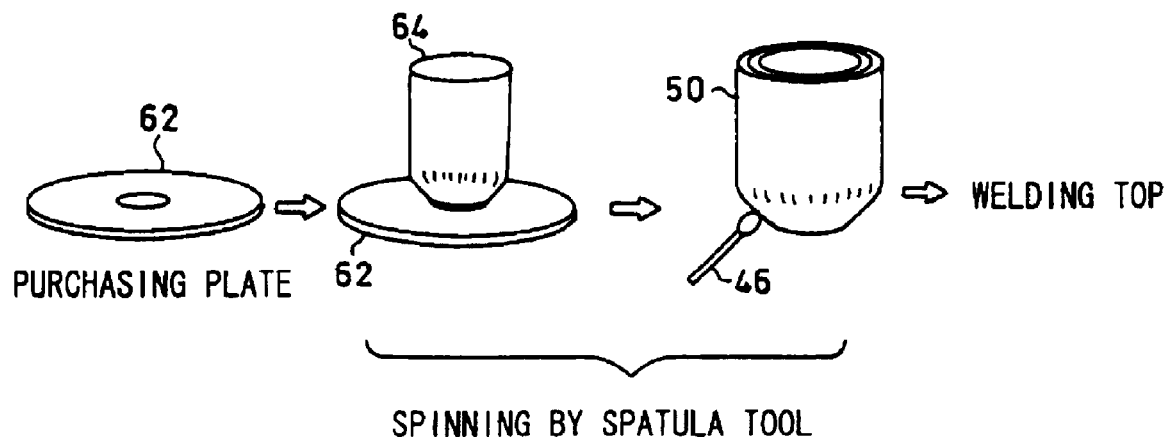
FIG. 6 shows perspective views illustrating a process for producing the radio frequency resonator canister according to the invention.

As illustrated in FIG. 6 in detail, the main body 50 is formed by spinning, wherein a disk-shaped plate 62 touching a die 64 is pressed with a spatula tool 46 to follow die's shape in one body. Then, the block 25 and the top 30 are welded to the main body 50. In the conventional canister production, however, the usage of very hard aluminum alloy for the dished head 26 and wall 28 did not allow the spinning to be applied to integral forming. While in this invention, the usage of the ductile pure aluminum, like A1050-0, enables the spinning to be applied to the integral forming of the main body. As an additional advantage, the work hardening during spinning increases the proof stress of the material, and consequently can ensure necessary mechanical strength of the canister.

The Irridite process greatly saves processing time (man-hour) and provides more uniform coating, if compared with conventional metallic plating to be performed after masking.

In addition, as being made of a material with low electrical resistance, the canister according to the invention needs no such conductive layer on the surface as copper plating for increasing its electrical conductivity.

Regarding the thermal conduction, which depends more on the bulk structural material than on the conventional plated layer, the increase in thermal conductivity of the structural material, as in this invention, is more appropriate means for increasing thermal conduction of the canister. Therefore, this invention allows the canister to be kept at lower temperatures, which reduces an efficiency drop caused by temperature rise, and eventually contributes to increased stability of the resonator system.

In the present invention, playing a role as good electrical conductor, the structural material itself provides the resonator canister with enough electrical conductivity, even though its electrical conductivity is lower than the one of an ideal copper plated container. Moreover, as the dispersion of conductivity in the canister can be smaller than in the conventional copper plated one, eventually the dispersion of the performance of the resonators can also be small. Consequently, higher guaranteed performance can be ensured as resonator.

Thus, the combination of the pure aluminum based material and the integral forming of the main body can provide the canister with enough electrical and thermal conductivity, together with necessary mechanical strength. In addition, the Irridite process improves corrosion resistance and electrical conductivity of the container.

Although, in the abovementioned embodiment, this invention is applied to radio frequency resonators used in a linear accelerator of an ion implanter, its application is not limited to the above example, but can apparently be extended also to other radio frequency resonators used in plasma generators, radio frequency exciters, etc.

EXAMPLES

Expressing the electrical conductivity in terms of "International Annealed Copper Standard (IACS) Conductivity," wherein the standard annealed copper is assumed to have 100% IACS conductivity, the conductivity of the radio frequency resonator is 43% of the conventional aluminum alloy A6061-T6, but 61%, of the pure aluminum A1050-0 used in the invention. The container of the invention has been proved to have higher electrical conductivity.

The thermal conductivity has also proved to be higher according to the invention: 0.17 kW/m° C. for the aluminum alloy A6061-T6 used in the conventional resonator, while 0.23 kW/m° C. for the pure aluminum A1050-0 in the invention.

Regarding the mechanical strength, the container of the invention is strengthened by the work hardening during spinning, but is not so strong as the conventional one made of aluminum alloy. However, by increasing wall thickness to, for example, 3.1 mm or larger for the single-layered cylinder 28 and 3.5 mm or larger for the dished head 26, the mechanical strength can clear legal safety standards in high pressure gas preservation related statues; there can be no problem in this matter.

The Irridite process has also proved to be able to form thin and relatively strong coating on the container surface by immersing the container in the Irridite No. 14 solution specified for use in aluminum based materials.

Having now fully described the invention, it will be apparent to one of ordinary skill in the art that many changes and modifications can be made thereto without departing from the spirit and scope of the invention as set forth herein.

What is claimed is:

1. A radio frequency resonator comprising:
   a canister made of an aluminum based material in which at least a dished head and a wall part are integrally formed in one body; and wherein said aluminum based material is a pure aluminum.

2. The radio frequency resonator according to claim 1, wherein said pure aluminum is A1050-0.

3. The radio frequency resonator according to claim 1, wherein a corrosion-proof protective coating is formed on a surface of said canister.

4. The radio frequency resonator according to claim 3, wherein said corrosion-proof protective coating is a irridite.

5. A radio frequency resonator with a canister comprising; a main body having a dished head and a wall part, both of which are made of an aluminum based material and are integrally formed in one body; and a block and a top, both of which are made of an aluminum alloy, and are welded to said main body; wherein said aluminum based material is a pure aluminum.

6. The radio frequency resonator according to claim 5, wherein said pure aluminum is A1050-0, and said aluminum alloy is A5052-H112.

7. The radio frequency resonator according to claim 5, wherein a whole surface of said canister, including inner and outer surfaces, is covered with a corrosion-proof protective coating.

8. The radio frequency resonator according to claim 7, wherein said protective coating is a irridite.

* * * * *